United States Patent [19]

Yamamoto

[11] Patent Number: 4,951,111
[45] Date of Patent: Aug. 21, 1990

[54] INTEGRATED CIRCUIT DEVICE
[75] Inventor: Hirohiko Yamamoto, Tokyo, Japan
[73] Assignee: Nippon Electric Co., Ltd., Japan
[21] Appl. No.: 689,491
[22] Filed: Jan. 3, 1985

Related U.S. Application Data

[63] Continuation of Ser. No. 427,883, Sep. 29, 1982, abandoned, which is a continuation of Ser. No. 199,278, Oct. 21, 1980, abandoned, which is a continuation of Ser. No. 15,758, Feb. 27, 1979, abandoned, which is a continuation of Ser. No. 844,395, Oct. 21, 1977, abandoned, which is a continuation of Ser. No. 694,829, Jun. 10, 1976, abandoned.

[30] Foreign Application Priority Data

Jun. 13, 1975 [JP] Japan .................................. 50-71773

[51] Int. Cl.[5] .......................................... H01L 27/105
[52] U.S. Cl. ..................................... 357/41; 357/23.9; 357/45
[58] Field of Search ........................... 357/23.9, 41, 45

[56] References Cited

U.S. PATENT DOCUMENTS 3,475,621 10/1969 Weinberger ........................... 357/44
3,541,543 11/1970 Crawford et al. ..................... 357/45
3,821,781 6/1974 Chang et al. ........................... 357/59
3,891,190 6/1975 Valasz .................................... 357/59
3,987,418 11/1976 Buchanan .............................. 357/59

OTHER PUBLICATIONS

Crawford, MOSFET in Circuit Design (McGraw-Hill, NY, 1967) pp. 113-115.
Rodgers, IEEE J Solid State Circuits vol. SC9, no. 5, Oct. 1974, pp. 247-249.
Faggin et al., Solid State Electronics, vol. 13, Aug. 1970, p. 1143.
Boysel, Electronics, Feb. 6, 1967, pp. 92-97.

Primary Examiner—William D. Larkins
Attorney, Agent, or Firm—Hopgood, Calimafde, Kalil, Blaustein & Judlowe

[57] ABSTRACT

An integrated circuit device includes insulated-gate field effect transistors employing a semiconductor gate electrode used as a logic element. Part of the input interconnection layer serves as the semiconductor gate electrode and orthogonally intersects with a conductive layer. The logic circuits are interconnected to constitute a random gate logic circuit that can be operated at high speeds and formed with a high density.

9 Claims, 3 Drawing Sheets

INTEGRATED CIRCUIT DEVICE

This application is a continuation of application Ser. No. 427,883, filed Sept. 29, 1982, now abandoned; which is a continuation of application Ser. No. 199,278, filed Oct. 21, 1980, now abandoned; which is a continuation of application Ser. No. 015,758, filed Feb. 27, 1979, now abandoned; which is a continuation of application Ser. No. 844,395, filed Oct. 21, 1977, now abandoned; which is a continuation of application Ser. No. 694,829, filed June 10, 1976, now abandoned.

The present invention relates to high-density integrated circuit devices employing as basic logic elements insulated-gate field-effect transistors with gate electrodes comprised of semiconductor layers.

In the design of a complex logic circuit, particularly a random gate logic circuit, in the form of an integrated circuit device employing MOS transistors as basic logic elements, the building-block method has been used to shorten the time required for circuit design and to avoid errors in designing new complex circuit patterns. According to the building-block method, circuit patterns of various unit logic circuits are designed in advance and registered as the respective blocks, and a designer of a complex logic circuit only needs to make a layout design of the necessary blocks by interconnecting the necessary blocks with wiring layers. This approach, however, involves two drawbacks; first, a considerable area is required for the integrated circuit on a semiconductor chip, because the width of the complex logic circuit is approximately proportional to the number of input and output wiring layers. Therefore, the density of integration is limited to a low extent. Secondly, the length of the wiring layers from one unit logic circuit to another is long, causing the stray capacity along the wiring layers to be increased and the switching speed of the circuit to be slowed proportional to the stray capacity.

One prior art solution to this problem in integrated circuits employing metal gate type MOS transistors is to incorporate the transistors used as logic elements into an interconnection wiring structure, as shown, for example, by the layout illustration of a 16-word memory on page 95 of "Electronics", Feb. 6, 1967, by the one-dimensional layout of NOR gate circuits of FIG. 5 on page 185 of "IEEE Journal of Solid-state Circuits", Vol. SC-2, No. 4, Dec. 1967, and in the U.S. Pat. No. 3,475,621 issued to Weinberger on Oct. 28, 1969. This approach is, however, not practicable to integrated circuits employing MOS transistors of the type in which the gate electrode is comprised of a semiconductor layer, for the reason described below. For ease of explanation, a silicon gate type MOS transistor in which polycrystalline silicon is used as a semiconductor gate electrode, is utilized in the exemplary embodiments described hereinafter.

In integrated circuits employing silicon gate type MOS transistors, diffused regions cannot be formed in the area underlying the polycrystalline silicon layer because of limitations of the device fabrication such as that the doping of an impurity into the polycrystalline silicon layer is done concurrently with the forming of the diffused regions including the source and drain regions. Hence, it is impossible to arrange the input wiring layers of polycrystalline silicon so as to intersect perpendicularly with the source and drain regions that are common for the respective transistors, which is possible in case of metal gate type MOS transistors. This makes it impossible to realize a random gate logic circuit by forming the silicon-gate transistors integral with the input and output interconnection wirings as in the case of metal-gate transistors.

It is therefore an object of the invention to provide an integrated circuit device comprising silicon-gate type transistors and having a high density of integration.

It is another object of this invention to provide a novel interconnection arrangement for integrated circuits employing silicon gate type transistors as basic logic elements.

It is another object of the invention to provide a novel method of forming a random gate logic circuit by incorporating transistors into the area of input and output wiring layers made of a semiconductor.

According to this invention, ap insulated-gate field-effect transistor as a basic logic element has a gate electrode which is common to an input signal wiring layer formed of a laterally extended layer of semiconductor such as polycrystalline silicon and a source connected to an elongated connection region which is formed in the substrate semiconductor and which is arranged adjacent to and in parallel with the input signal wiring layer and connected to a reference potential. The elongated connection region in the semiconductor substrate may be a one-conductivity-type region formed in the substrate of the opposite conductivity type by diffusing or implanting an impurity of the one conductivity type into the substrate. A longitudinally elongated unit logic circuit is formed by arranging one or more of the transistors in the longitudinal direction and connecting the drain of the respective transistor to a longitudinally extended common metallic layer and further via a load device to a power source to generate a logic function. The longitudinally elongated unit logic circuit further includes an output signal wiring layer formed of a laterally extended layer of semiconductor such as polycrystalline silicon and connected to the common metallic layer. A plurality of the similar unit logic circuits are disposed adjacently and interconnected to each other, so that the output signal wiring layer of one unit logic circuit serves as the input signal wiring layer of another unit logic circuit, whereby a random gate logic circuit is constituted in which the input and output signal wiring regions and the logic element regions are overlapped on each other in an integral structure. According to the invention, part of the input and output interconnection layer perseveres as the semiconductor gate electrode of the transistor as the logic element and further intersects perpendicularly with the metallic layer, thus permitting the logic circuits to be efficiently-incorporated into the input and output interconnection wiring regions. A random gate integrated circuit device that can operate at a higher switching speed can be formed with a high packing density.

Further objects, features and advantages of the invention will become more apparent from the following description when read in conjunction with the accompanying drawings, in which.

In FIGS. 1 to 7, the reference letters A to E indicate unit logic circuits (NOR circuits) and the reference letters a to l indicate input and/or output terminals or input and/or output wiring lines of the respective unit logic circuits. In FIGS. 2 and 4 to 7, $Q_{L1}$ to $Q_{L5}$ indicate load transistors of the insulated-gate field-effect type, while $Q_1$ to $Q_{13}$ indicate transistors of the same type used as basic logic elements.

Figure 1:
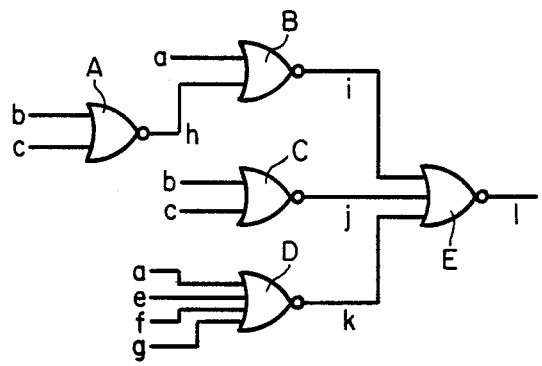
FIG. 1 is a diagram of an example of a random gate logic circuit represented by logic symbols.

Now referring to FIG. 1, a complex, random gate logic circuit which is an example of a circuit to be realized as an integrated circuit device comprises five unit logic circuits A to E each having a NOR gate function. The first unit logic circuit A has two inputs b and c and its output h is connected to the second unit logic circuit B as one of its two inputs a and h. The third unit logic circuit C has two inputs b and d of which input b is common with logic circuit A, and the fourth logic circuit D has four inputs a, e, f, and g of which input a is common with logic circuit B. Outputs i, j and k of the unit logic circuits B, C and D are connected to the fifth unit logic circuit E as its three inputs. The logic circuit E has an output l.

Figure 2:
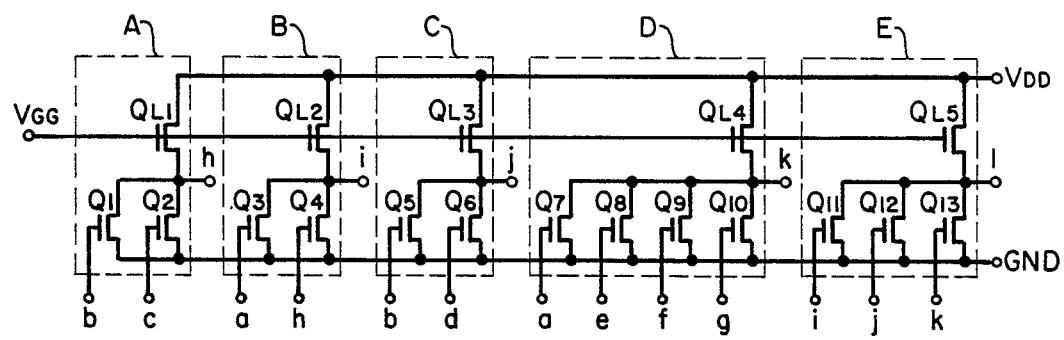
FIG. 2 is a diagram of an equivalent circuit of the circuit of FIG. 1 expressed by transistor symbols.

FIG. 2 shows circuit arrangements of the unit logic circuits A to E where insulated-gate field effect transistors are employed for these circuits. The first unit logic circuit A includes two transistors $Q_1$ and $Q_2$ as basic logic elements, their gates being respectively connected to the inputs b and c of the logic circuit A, their sources being connected in common to the ground GND, and their drains being connected in common to the output h of the logic circuit A. The circuit A further includes a load transistor $Q_{L1}$ connected between the drains of the transistors $Q_1$, $Q_2$ and a power supply $V_{DD}$, its gate being connected to a potential $V_{GG}$. Similarly, the other unit logic circuits B to E comprises transistors $Q_3$ to $Q_{13}$ having gates connected to the inputs of the respective logic circuits, sources connected in common to the ground GND, and drains connected to the outputs of the respective circuits, and load transistors $Q_{L2}$ to $Q_{L5}$ connected between the outputs of the respective logic circuits and the power supply $V_{DD}$.

Figure 3:
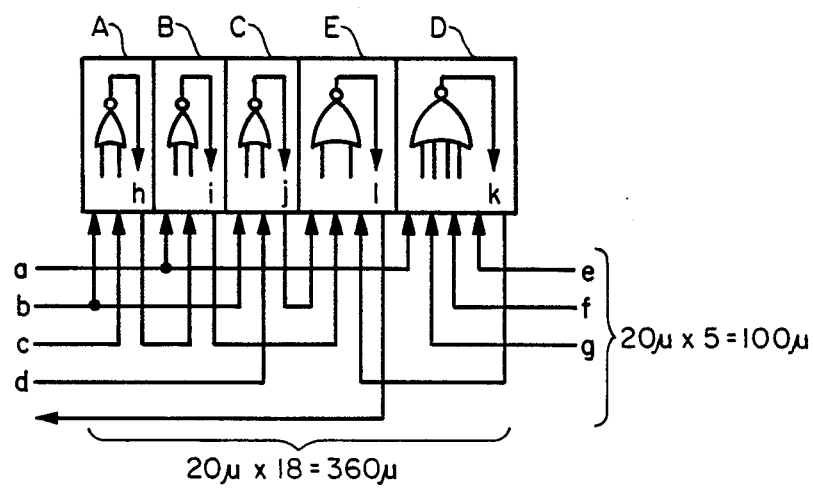
FIG. 3 is a diagram showing an example of an arrangement of unit logic circuits and the interconnection thereof for realizing the circuit of FIG. 1 according to the conventional building block method.

FIG. 3 shows an arrangement of the unit logic circuits A to E and interconnections a to ( thereof according to the conventional building block method to realize the complex logic circuit of FIG. 1. Patterns of the unit logic circuits A to E are designed in advance to realize the respective circuit arrangements shown in FIG. 2. Layouts of the unit logic circuits A to E and input and output interconnection wirings a to l are designed to form the circuit of FIG. 1. The number of interconnection wirings in the lateral direction amounts to 18, and that in the longitudinal direction is 5. Assuming that each interconnection wiring has a pitch of 20 pm (i.e. a sum of the width of each wiring layer and that of the clearance between the adjacent wiring layers) in both directions, the interconnection wirings region needs a width of 20 $\mu m \times 18 = 360$ pm and a length of 20 $\mu m \times 5 = 100$ $\mu m$ and hence occupies an area as large as 36000 $\mu m^2$. The necessity of such a large area for the interconnection wirings a to l in addition to an area for the unit logic circuits A to E on a semiconductor chip obviously lowers the integration density. Moreover, long interconnection wirings increase the parasitic capacitance and decrease the operating speed of the circuit.

Now referring to FIGS. 4 to 7, a preferred embodiment of the invention will be described. This embodiment realizes the random gate circuit of FIG. 1, with the respective unit logic circuits A to E having the circuit arrangements of FIG. Z, as a semiconductor integrated circuit. In this embodiment, n-channel silicon-gate type MOS transistors are employed as basic logic elements. A semiconductor substrate 1 of p-type silicon having a resistivity of 4 $\Omega$-cm is prepared, and n+type impurity-diffused regions are formed in the surface of this substrate for use as source and drain regions of transistors and as laterally extending wiring regions. In FIGS. 4 to 7, the finely hatched portions having right-side down hatching lines indicate the n+diffused regions. The surface of the substrate 1, except for predetermined contact areas, is coated with a silicon oxide film Z. At the gate regions of the respective transistors, the silicon oxide film Z is made thin and serves as gate insulation films Z0 to Z9. Polycrystalline silicon layers (indicated by the stipples in FIGS. 4 to 7) are formed on the silicon oxide film Z. The polycrystalline silicon layers on the thin oxide films, i.e., the gate insulation films Z0 to Z9, are used as gate electrodes 30 to 39 of the respective transistors. The polycrystalline silicon layers on the thick oxide film Z are used as laterally extending interconnection layers a to l. Except for the respective contact portions, the polycrystalline silicon layers and the silicon oxide film Z are covered with a silicon oxide film 4, on which alumina wiring layers 50 to 55, indicated by the coarsely hatched portions having right-side up hatching lines in FIGS. 4 to 7, are formed. These aluminum layers are connected with the silicon layers through contact openings formed in the silicon oxide film 4 or with the n+diffused regions by way of contact openings formed in the silicon oxide film 4 and the silicon oxide film 2, and are used as a laterally extending power supply line 50 or longitudinal interconnection layers 51 to 55 within the respective unit logic circuit blocks.

Figure 4:
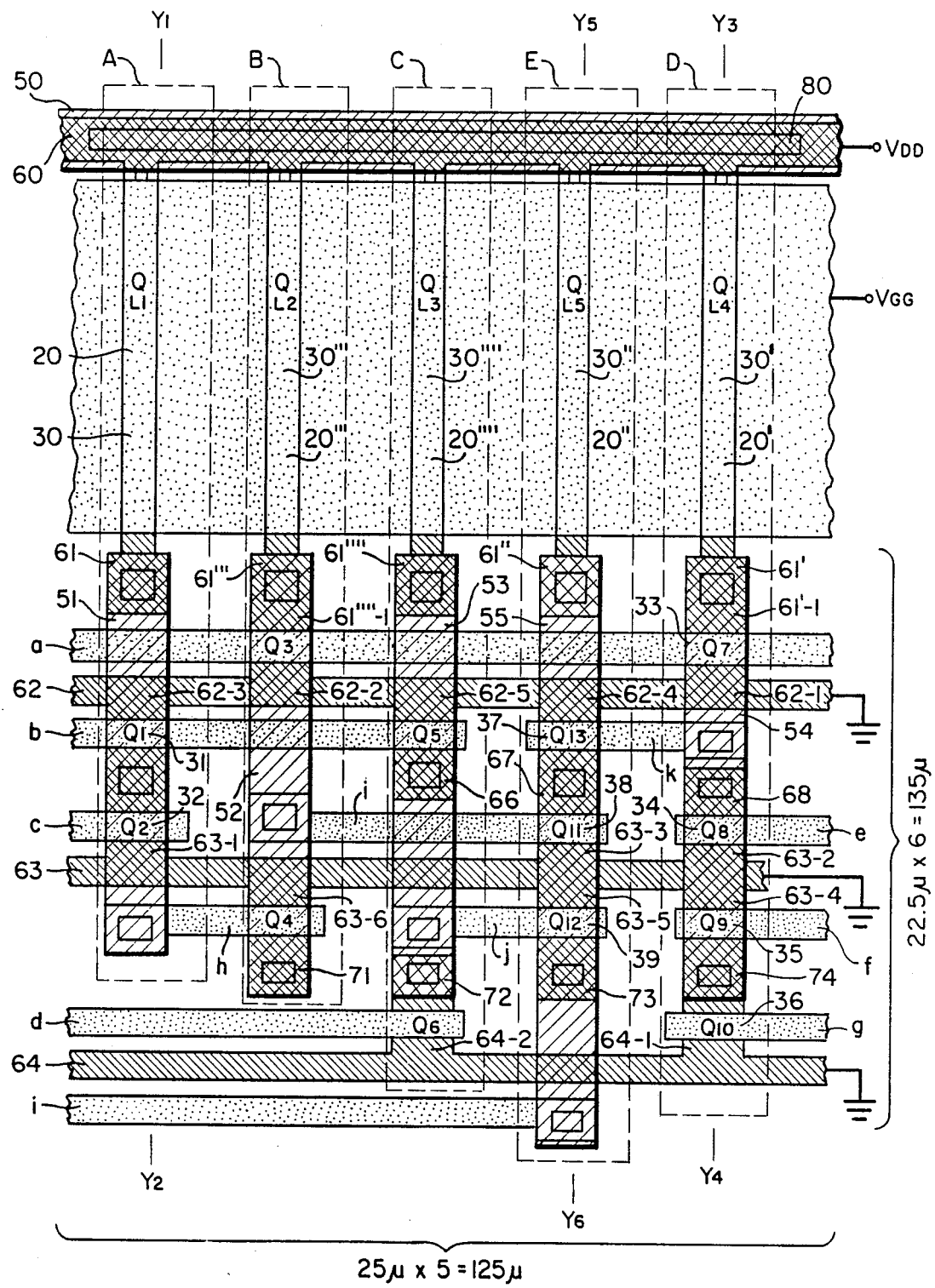
FIG. 4 is a plan view of a semiconductor integrated circuit device realizing the circuit of FIGS. 1 and 2 according to an embodiment of the invention.
Figure 5:
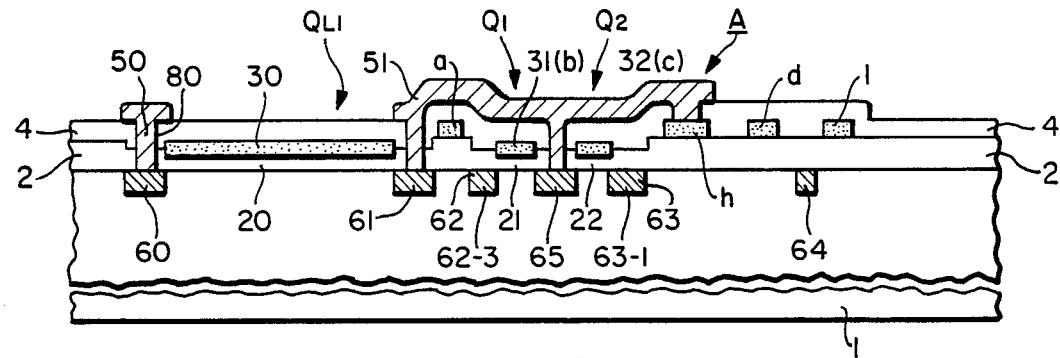
FIG. 5 is a cross-sectional view of the integrated circuit device across the line $Y_1-Y_2$ of FIG. 4.
Figure 6:
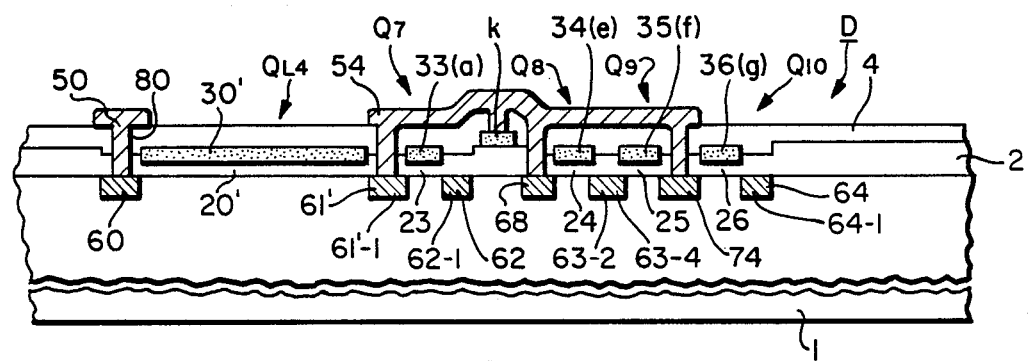
FIG. 6 is a cross-sectional view across the line $Y_3-Y_4$ of FIG. 4.

Further referring to FIGS. 1, 2 and 4 to 7, the unit logic circuit blocks A to E of FIGS. 1 and 2 are each elongated longitudinally and arranged in the order of A, B, C, E and D from the left in FIG. 4. In the uppermost part of the pattern shown in FIG. 4, an n+diffused region 60 is laterally extended to serve as the drain regions of load transistors $Q_{L1}$ to $Q_{L5}$ in the logic blocks A to E. This diffused region 60 has downwardly projected portions to be in contact with the gate regions of the individual load transistors. The aluminum wiring layer 50 is connected to the common drain diffused region 60 through a contact opening 80 and is also extended laterally and connected to a power source $V_{DD}$. Longitudinally elongated, five gate-insulation films 20 to 20'''' are formed with their upper ends in contact with the drain region 60. Five n+source diffused regions 61 to 61'''' are separately formed at the lower ends of the gate insulation films 20 to 20'''' respectively. A laterally extending silicon layer having a width equal to the length of the gate insulation films 20 to 20'''' is formed over the films 20 to 20'''' and connected to a power source $V_{GG}$. This silicon layer serves as gate electrodes 30 to 30'''' of the load transistors $Q_{L1}$ to $Q_{L5}$ on the gate insulation films 20 to 20''''. An elongated, uniformly wide silicon layer a extends laterally underneath and in parallels to the source regions 61 to 61'''' (FIG. 4). An elongated n+diffused region 62 also extends laterally underneath and in parallel to the silicon layer a, and is connected to the ground. In the blocks D and B, source regions 62-1 and 62-2 are formed in contact with the upper side of the diffused region 62. In the logic blocks A, E and C, source regions 62-3, 62-4 and 62-5 are formed in contact with the lower side of the diffused region 62. The input wiring layer a runs on the thick silicon oxide film in the logic blocks A (FIG. 5), C, and E (FIG. 7) and serves as a gate electrode 33 on the gate insulation film 23 in the logic block D (FIG. 6). This input wiring layer, together with the source region 62-1 and the drain region 61' connected to the source region 61' of the load transistor $Q_{L4}$, constitutes a transistor $Q_7$. In the logic block B, the logic input wiring layer a similarly serves as a gate electrode which, together with the source region 62-2 connected to the grounded n+region 62 and the drain region 61''''-1 connected to the source 61'''' of the load transistor $Q_{L2}$, constitutes a transistor $Q_3$. Underneath the grounded region 62 (FIG. 4), a silicon layer b extending from the logic block A to the block C, and a silicon layer k extending from the block E to the logic block D are disposed adjacent and in parallel to the grounded region 62. Underneath silicon layers b and k, four mutually independent n+diffused regions 65 to 68 are disposed in the logic blocks A, C, E and D, respectively. Silicon layers c, i, and e are formed below these diffused regions; the layer c is extended into the logic block A; the layer i is extended across the logic blocks B, C and E; and the layer e is extended out of the logic block D toward the right. Underneath these layers, a grounded n+diffused region 63 is laterally extended across all the logic blocks. Thereunder, silicon layers h, j and f are disposed across the logic blocks A and B, the logic blocks C and E, and out of the block D rightward, respectively. Below these layers, four separate n+diffused regions 71 to 74 are disposed laterally in the logic blocks B, C, E and D, respectively. Thereunder, silicon layers d and g are extended into the logic block C and out of the logic block D rightward, respectively. Underneath the layers d and g is a grounded n+diffused region 64 extended laterally. Thereunder, a silicon layer l is laterally extended into the logic block E from the left.

Thus, as shown in FIGS. 4 and 5, the longitudinally elongated unit logic circuit block A comprises three longitudinally disposed transistors: the load transistor $Q_{L1}$ mentioned in the foregoing; the transistor $Q_1$ having the silicon gate electrode 31 on the gate insulation film 21 connected to the input wiring layer b, the source region 62-3 connected to the grounded region 62, and the drain region of the n+diffused region 65; and the transistor Q2 having the silicon gate electrode 32 on the gate insulation film 22 connected to the input wiring layer c, a source region 63-1 connected to the grounded region 63, and the drain region of the n+diffused region 65. The source 61 of the load transistor $Q_{L1}$ is connected by the longitudinally elongated aluminum wiring layer 51 to the common drain region 65 of the transistors Q1 and Q2, thus forming a two-input NOR circuit. A silicon output wiring layer h connected to the aluminum layer 51 is extended from the logic block A and serves as an input wiring layer to another logic block.

Referring to FIGS. 4 and 6, the unit logic block D comprises five transistors: the load transistor $Q_{L4}$ and transistor $Q_7$ mentioned in the foregoing; a transistor $Q_8$ having its drain region constituted of the n+diffused region 68, its gate electrode 34 constituted of the silicon input wiring layer e, and its source region constituted of the n+region 63-2 connected to the grounded region 63; a transistor $Q_9$ having its source constituted of the n+region 63-4 connected to the grounded region 63, its gate electrode 35 constituted of the silicon input wiring layer f, and its drain constituted of the n+region 74; and a transistor $Q_{10}$ having its drain constituted of the n+region 74, its gate electrode 36 constituted of the silicon input wiring layer g, and its source constituted of the n+region 64-1 connected to the ground region 64. The longitudinally elongated aluminum layer 54 interconnects the drain electrodes 61', 68 and 74 of the transistors $Q_7$ to $Q_{10}$, which are connected to the silicon output wiring layer k, thus forming a four-input NOR circuit.

Figure 7:
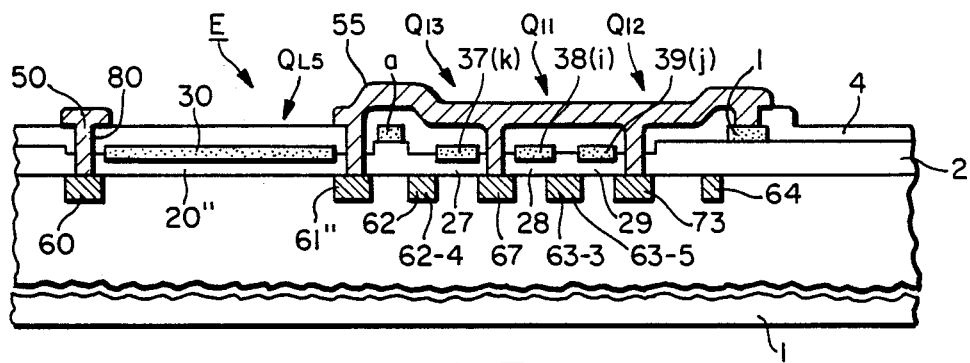
FIG. 7 is a cross-sectional view across the line $Y_5-Y_6$ of FIG. 4.
Figure 8:
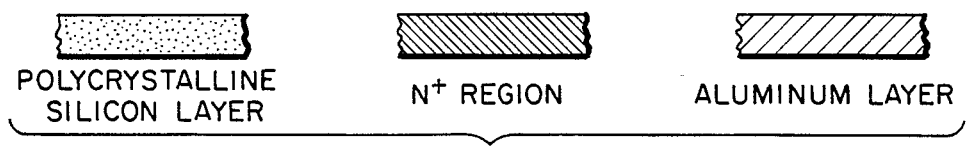
FIG. 8 shows that in the plan view of FIG. 4 and in the cross-sectional views of FIGS. 5 to 7, the stippled areas indicate polycrystalline silicon layers, the hatched areas with dense, right-side down hatching lines indicate n+diffused regions, and the other hatched areas with large, right-side up hatching lines indicate aluminum layers.

Referring to FIGS. 4 and 7, the unit logic circuit block E comprises: the load transistor $Q_{L5}$; a transistor $Q_{13}$ having its source constituted of the n+region 62-4 connected to the ground region 62, its gate electrode 37 constituted of the logic circuit silicon input wiring layer k led from the block D, and its drain constituted of the n+region 67; a transistor $Q_{11}$ having its drain constituted of the n+region 67 in common to the transistor $Q_{13}$, its gate electrode 38 led from the output wiring layer i of the logic block B, and its source constituted of the n+region 63-3 connected to the ground region 63; and a transistor $Q_{12}$ having its source constituted of the n+region 63-5 connected to the ground region 63, its gate electrode 39 led from the polysilicon output wiring layer j of the logic block C, and its drain constituted of the n+region 73. The aluminum electrode 55 interconnects the source 61'' of the load transistor $Q_{L5}$, the common drain 67 of the transistors $Q_{13}$ and $Q_{11}$, the drain 73 of the transistor $Q_{12}$, and the silicon output wiring layer (, thereby forming a three-input NOR gate. Similarly, the logic circuit block B comprises three longitudinally disposed transistors: the load transistor $Q_{L2}$ and transistor $Q_3$ mentioned in the foregoing; and a transistor $Q_4$ having its source constituted of the region 63-6 connected to the ground region 63, its gate electrode constituted of the silicon layer h connected to the output of the logic block A, and its drain constituted of an independent n+diffused region 71. The aluminum wiring layer 52 interconnects the drain regions 61''' and 71 of the transistors $Q_3$ and $Q_4$ and the silicon output layer i together, thereby forming a two-input NOR gate circuit. The logic circuit block C comprises: the load transistor $Q_{L3}$; a transistor $Q_5$ having its source constituted of the n+region 62-5 connected to the ground region 62 its gate electrode connected to the silicon input wiring layer b and its drain constituted of an independent n+region 66; and a transistor $Q_6$ having its drain constituted of an independent n+region 72, its gate electrode connected to the silicon input wiring layer d, and its source constituted of the n+region 64-2 connected to the ground region 64. The aluminum wiring layer 53 interconnects the source region 61'''' of the load transistor $Q_{L3}$, the drain regions 66 and 72 of the transistors $Q_5$ and $Q_6$, and the silicon output wiring layer j together, thereby forming a two-input NOR gate circuit.

In this circuit construction, the $n^{30}$ diffused regions and the polycrystalline silicon layers are laterally disposed without being superposed upon each other, and the aluminum wiring layers are intersected with and/or superposed upon the $n^{30}$ diffused regions and the polycrystalline silicon layers. In the above embodiment, the source regions are projected from the grounded regions 62 to 64 in the areas where transistors are formed. Instead of this construction, a grounded region of uniform width may be formed, which is used to serve as the source region, and the silicon layers a to k partially widened portions come in contact with the source regions in a plan view, and narrowed in the areas where no transistors are formed so that the narrowed portions remain apart from the grounded regions. As described above, the contact of the aluminum wiring layer with the drain region and that of the aluminum layer with the silicon output wiring layer are positioned adjacently but separately in each block, such as in the logic circuit block D where the drain region 68 and the silicon output layer k are in contact with the aluminum layer 54 and in the logic circuit block C where the drain region 72 and the output layer j are in contact with the aluminum layer 53. Instead of providing such contact areas separately, the contact areas may be combined together in such manner that the silicon layer is brought into direct contact with the drain region and the aluminum wiring layer is brought into contact with the silicon layer. This approach will reduce the area required for inter-region contacts, although the number of masking steps increases by one.

according to the invention, as has been described above the input and output interconnection wiring layers extend laterally, while transistors are disposed longitudinally in the wiring regions with their electrodes interconnected by longitudinal aluminum wiring layers, whereby a high density random gate type integrated circuit is realized. In practice, the integration of the circuit of the invention is about twice that which can be attained according to prior art techniques; for example, the wiring area required in the arrangement of the invention shown in FIG. 4 is only 16,875 $\mu m^2$ (125 $\mu m$ wide $\times$ 135 $\mu m$ long), against 36,000 $\mu m^2$ (360 $\mu m$ wide $\times$ 100 $\mu$long) required in the arrangement according to the conventional building block method as in FIG. 3. The stray capacity seen by the output against ground potential is approximately proportional to the length of the output wiring. In the circuit of the invention, the output wiring length is about $\frac{1}{2}$ to $\frac{1}{3}$ of that in the circuit formed by the conventional building block method, as will be apparent from FIG. 4 in comparison with FIG. 3. Because the switching time and delay time of a logic circuit decreases in proportion to the output capacity, the circuit of the invention can operate at a speed 2 to 3 times higher than the conventional circuit.

In the foregoing embodiment of the invention, enhancement type load transistors are used. Instead, depletion type load transistors may be used. In this case, the size of the load transistor can be made very small, thus enabling circuit integration to be increased. In disclosed embodiment, the NOR circuits with 2 to 4 inputs have been described. Although, according to the conventional building block method, the wiring area becomes larger with an increase in the number of NOR circuit inputs, an increase in the number of NOR circuit inputs cannot result in a substantial amount of increase in the area required for wiring regions in the circuit of the invention. Generally, circuit integration over that which is available with the prior art circuit, where inputs of each NOR gate are as many as 5 to 10.

While a simple embodiment of the invention has been described, it is to be understood that the invention is not limited to this particular embodiment. For example, p-channel silicon gate type MOS transistors may be used instead of n-channel type. The logic circuit may be an inverter circuit or a complex combination of circuits. The load MOS transistors may be suitably disposed according to applications. The $n^+$region may be formed by a suitable technique such as ion implanting technique instead of diffusion process. In the disclosed embodiment, polycrystalline silicon is used for the semiconductor layer. Instead, other semiconductor layers may be used. Further, instead of the aluminum wiring layer, a layer of another metal or other conductive material may be used.

What is claimed is:

1. An integrated circuit device comprising a plurality of unit logic circuits arranged in parallel with each other and each elongated in a longitudinal direction, each of said logic circuits including at least one insulated-gate field effect transistor as a logic element arranged in the longitudinal direction, an input signal polysilicon wiring layer formed of a laterally extended semiconductor layer on a semiconductor substrate as a first level of layer, an output signal wiring layer formed of a laterally extended semiconductor layer on said semiconductor substrate at said first level of layer, a metal conductive layer formed as a second level of layer above said first level of layer, said metal conductive layer extending in the longitudinal direction and connected to the drain of said at least one transistor at a first portion thereof over the drain of said transistor and to said output signal wiring layer at an intersection therebetween separate from said first portion, and a laterally extended diffusion region formed in the semiconductor substrate and connected to a reference potential, said input and output signal wiring layers and said diffusion region having substantially no superposition therebetween, the source of said at least one transistor being connected to said laterally extended diffusion region, part of said input signal wiring layer serving as the silicon gate electrode of said transistor, said unit logic circuits being interconnected to constitute a random gate logic circuit, said interconnection of said unit logic circuits including a connection of said output signal wiring layer of one of said unit logic circuits, through the area of another of said unit logic circuits without connection as the input of said another of said unit logic circuit, to said input signal wiring layer of still another of said unit logic circuits.

2. The integrated circuit device of claim 1, in which said laterally extended semiconductor layer is comprised of polycrystalline silicon.

3. The integrated circuit device of claim 2, in which said conductive layer is comprised of aluminum.

4. The integrated circuit device of claim 1, in which said conductive layer is overlapped with said transistor in each of said unit logic circuits.

5. An integrated circuit device comprising a first group of a plurality of insulated-gate field effect transistors arranged longitudinally, second and third groups of a plurality of insulated-gate field effect transistors each arranged longitudinally and disposed in parallel with said first group of transistors, a first metal conductive layer extending longitudinally and connected to the drains of said first group of transistors, second and third metal conductive layers each extending longitudinally and in parallel with said first conductive layer and respectively connected to the drains of said second and third groups of transistors, and first to third conductive layers being formed as a first level of layer, and a plurality of laterally extending polysilicon semiconductor layers serving as the silicon gate electrodes of the transistors of said first to said third groups, said laterally extending semiconductor layers being formed as a second level of layer lower than said first level of layer, said plurality of laterally extending semiconductor layers having substantially no superposition over the drains and sources of said groups of transistors, one of said semiconductor layers being connected to said first conductive layer at an intersection therebetween at a location different from a connecting portion to the drain of the transistor and passing through a area of said second group of transistors without connection as the input of said second group of transistors and serving as the gate electrode of one of said third group of transistors, and the sources of the transistors of said first, second and third groups being connected in common by a semiconductor wiring region formed in a semiconductor substrate laterally extending without superposing with said semiconductor layer.

6. An integrated circuit device comprising a plurality of unit logic circuits arranged in parallel with each other, each of said logic circuits being elongated in the longitudinal direction, each of said logic circuits including at least one insulated-gate field effect transistor as a logic element arranged in the longitudinal direction, an input signal wiring layer formed of a laterally extended polysilicon conductive film formed as a first level of layer, an output signal wiring layer formed of a laterally extended polysilicon conductive film formed as said first level of layer, a conductive metal layer extending in the longitudinal direction and overlying said transistor in each of said unit logic circuit, said conductive layer being formed as a second level of layer above said first level of layer, said metal conductive layer being connected to said output signal wiring layer at an intersection therebetween, and a laterally extended diffusion region formed in the semiconductor substrate and connected to a reference potential, said input and output signal wiring layers and said diffusion region having substantially no superposition therebetween, the source of said transistor being connected to said laterally extended wiring region, the drain of said transistor being connected to said conductive layer at an area over said drain without directly contacting said output signal wiring, a part of said input signal polysilicon wiring layer serving as the silicon gate electrode of said transistor, said unit logic circuit being interconnected to constitute a random gate logic circuit, said interconnection of said unit logic circuits including a connection of said output signal wiring layer of one of said unit logic circuits, through the area of another of said unit logic circuits without connection as the input of said another of said unit logic circuits, to said input signal wiring layer of still another of said unit logic circuits.

7. An integrated circuit comprising a semiconductor substrate, a first laterally extended diffusion region formed in said semiconductor substrate and connected to a power voltage, a second laterally extending diffusion region formed in said semiconductor substrate and connected to a reference voltage, a plurality of unit logic circuits arranged in parallel with each other and each elongated in a longitudinal direction, each of said logic circuits including a load field-effect transistor having a drain coupled to said first wiring region and at least one logic field-effect transistor arranged in the longitudinal direction, an input signal polysilicon wiring layer formed of a laterally extending semiconductor layer as a first level of layer, an output polysilicon signal wiring layer formed of a laterally extending semiconductor layer as said first level of layer, an insulator film covering said input signal wiring layer and said output signal wiring layer, a metal conductive layer formed as a second level of layer above said first level of layer and intersecting with said input signal wiring layer and said output signal wiring layer through said insulator film, said conductive layer extending in the longitudinal direction and being connected to the drain of said logic transistor at a portion over said drain of said logic transistor and to said output signal wiring layer at an intersection therebetween through an opening formed in said insulator film, said portion being separate from said intersection, the source of said logic transistor being connected to said second wiring region, said input signal wiring layer, said output signal wiring layer, said first semiconductor region and said second semiconductor region being formed on separate regions from each other and having no superposition therebetween, a part of said input signal wiring layer serving as the silicon gate electrode of said logic transistor, said unit logic circuits being interconnected to constitute a random gate logic circuit, said interconnection of said unit logic circuits including a connection of said output signal wiring layer of one of said unit logic circuits, through the area of another of said unit logic circuits without connection as the input of said another of said unit logic circuits, to said input signal wiring layer of still another of said unit logic circuits.

8. The integrated circuit device of claim 7, in which said conductive layer is overlapped with said logic transistor in each of said unit logic circuits.

9. An integrated circuit device comprising a semiconductor substrate, a first insulator film on said substrate, a plurality of unit logic circuits arranged in parallel with each other, each of said logic circuits being elongated in the longitudinal direction, an input signal wiring layer formed of a laterally extending polycrystalline silicon film and on said first insulator film, an output signal wiring layer formed of a laterally extending polycrystalline silicon film and on said first insulator film, a second insulator film covering said laterally extending silicon film, a metal conductive layer formed on said second insulator film and extending in the longitudinal direction and overlying said transistor in each of said unit logic circuits, said conductive layer being connected to said output signal wiring layer at an intersection therebetween through a first contact opening formed in said second insulator film and connected to the drain of said logic transistor through a second contact opening formed in said first insulator film over said drain of said logic transistor, said first and second contact openings being spaced from each other, and a laterally extending diffusion region formed in the semiconductor substrate and connected to a reference potential, said input and output signal wiring layers and said wiring region having substantially no superposition therebetween, the source of said logic transistor being connected to said laterally extending diffusion region, a part of said input signal wiring layer serving as the gate electrode of said logic transistor, said unit logic circuits being interconnected to constitute a random gate logic circuit, said interconnection of said unit logic circuits including a connection of said output signal wiring layer of one of said unit logic circuits, through the area of another of said unit logic circuits without connection as the input of said another of said unit logic circuits, to said input signal wiring layer of still another of said logic circuits.

* * * * *